United States Patent
Leow

(10) Patent No.: US 9,442,167 B1
(45) Date of Patent: Sep. 13, 2016

(54) METHOD AND APPARATUS FOR USING TESTER CHANNEL AS DEVICE POWER SUPPLY

(75) Inventor: Boon Tean Leow, Bayan Lepas (MY)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 767 days.

(21) Appl. No.: 13/422,725

(22) Filed: Mar. 16, 2012

(51) Int. Cl.
*G01R 31/40* (2014.01)
*G01R 19/00* (2006.01)

(52) U.S. Cl.
CPC ......... *G01R 31/405* (2013.01); *G01R 19/0092* (2013.01)

(58) Field of Classification Search
CPC .... G01R 31/00; G01R 31/001; G01R 31/02; G01R 31/28; G01R 31/40
USPC ........... 324/750.01, 522–523, 750.3, 764.04, 324/120, 765; 700/286, 295–297
See application file for complete search history.

(56) References Cited

U.S. PATENT DOCUMENTS

| | | | |
|---|---|---|---|
| 5,059,889 A * | 10/1991 | Heaton ................... | 323/285 |
| 7,403,030 B2 * | 7/2008 | Walker et al. ............. | 324/750.3 |
| 2006/0116843 A1 * | 6/2006 | Kodera ................... | 702/124 |
| 2010/0153054 A1 * | 6/2010 | Horiguchi ............... | 702/120 |

* cited by examiner

*Primary Examiner* — Tung X Nguyen
(74) *Attorney, Agent, or Firm* — Heimlich Law, PC; Alan Heimlich, Esq.

(57) ABSTRACT

A method and apparatus for using a tester channel as device power have been disclosed. By utilizing a tester channel output as an input, a voltage and current driver are used to boost the input which is followed by a current to voltage converter which can be used as a device power supply for a device under test. Additional tester channels may be used to sense and force voltages, measure currents, supply output voltage, and relay control, etc. for changing operation.

16 Claims, 17 Drawing Sheets

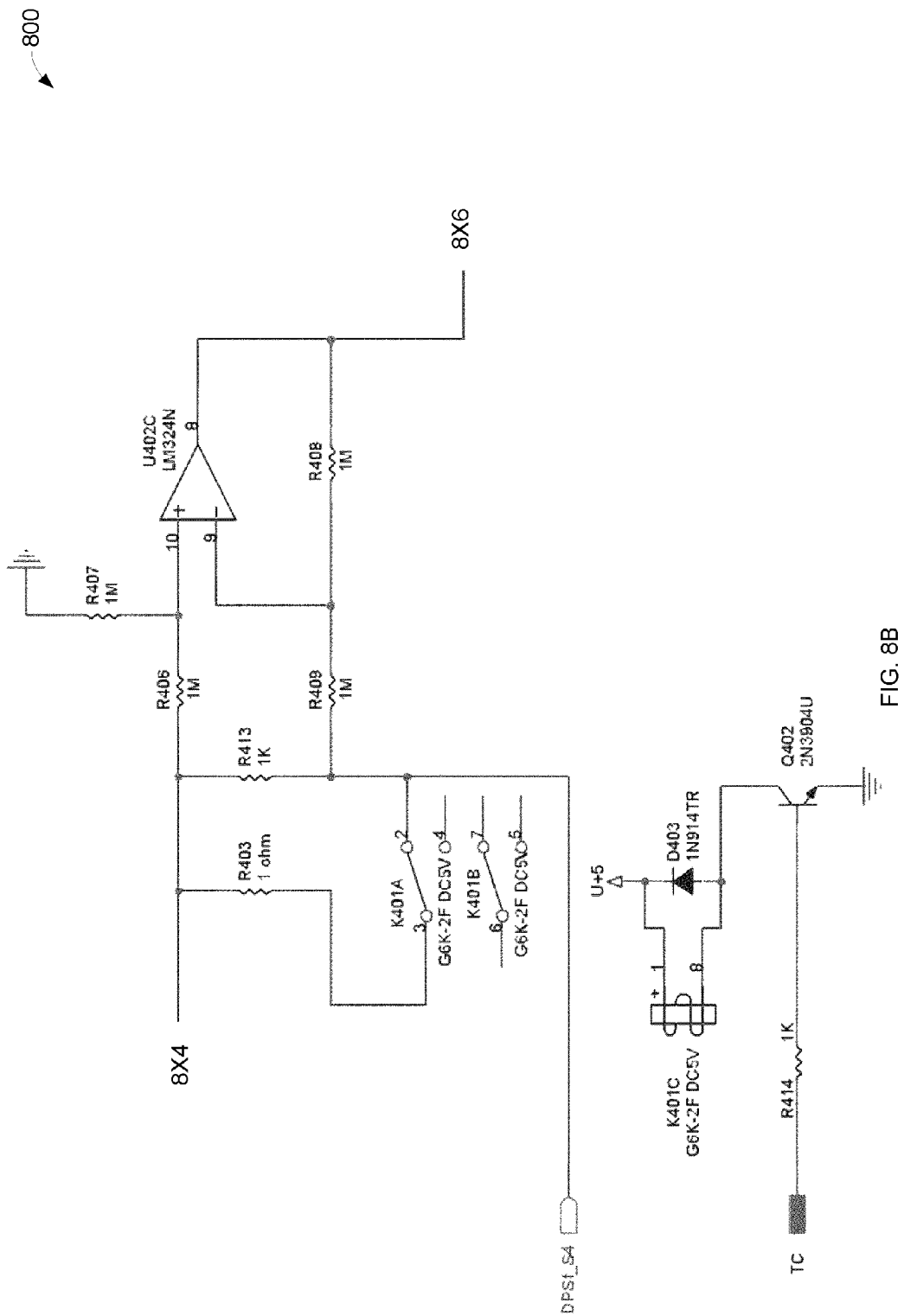

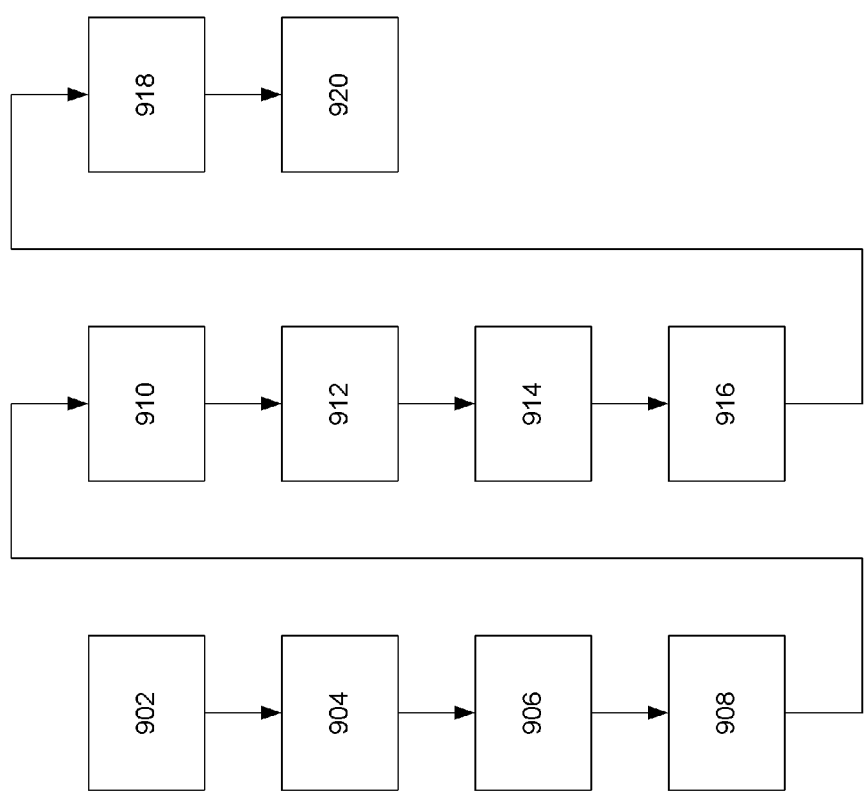

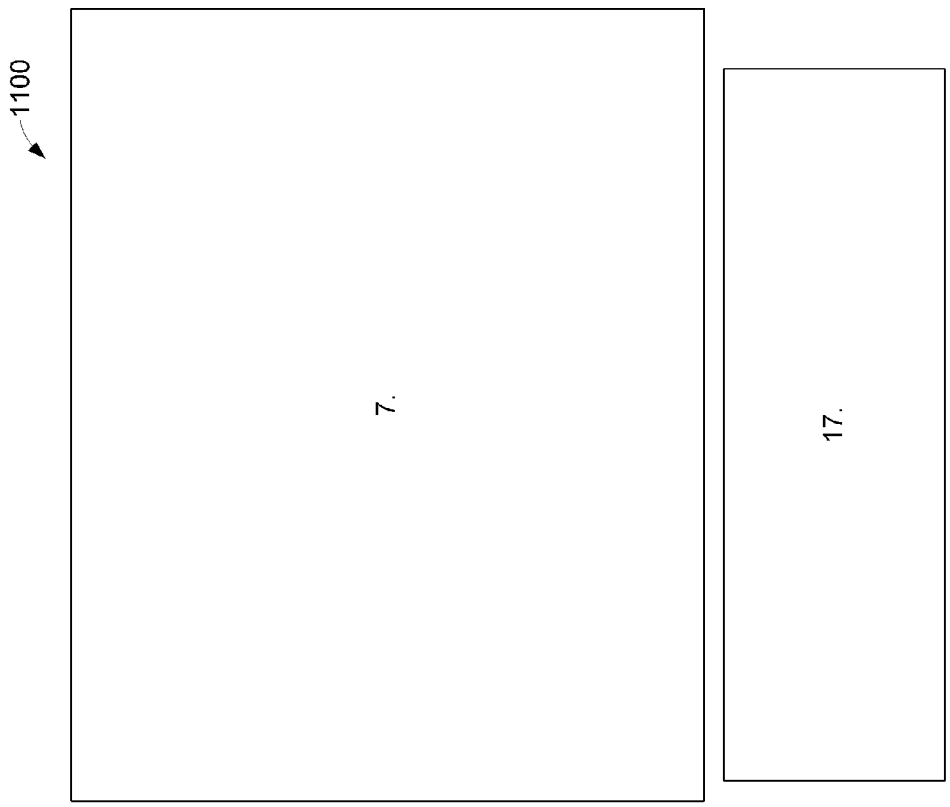
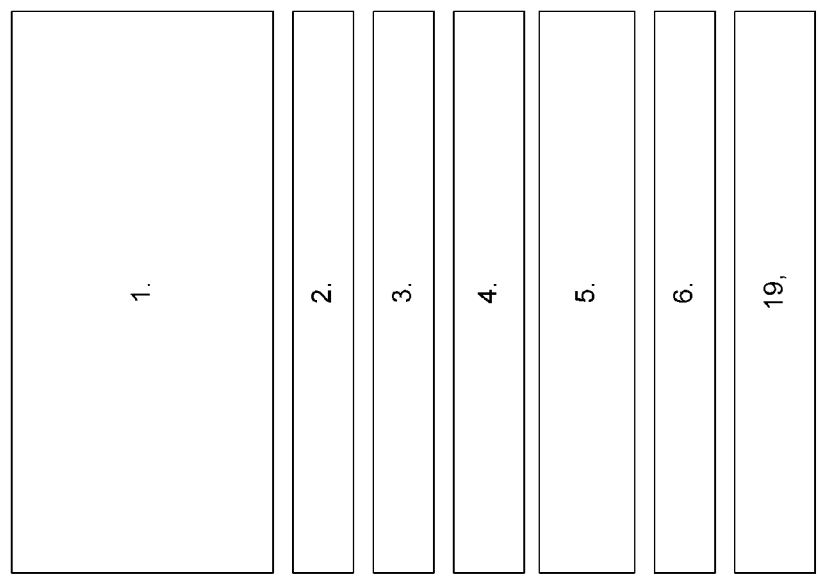
FIG. 11

METHOD AND APPARATUS FOR USING TESTER CHANNEL AS DEVICE POWER SUPPLY

FIELD OF THE INVENTION

The present invention pertains to device testing. More particularly, the present invention relates to a Method and Apparatus for using Tester Channel as Device Power Supply.

BACKGROUND OF THE INVENTION

Test of electronic devices is needed to insure that they meet specifications. Test systems can be very very expensive because they must be capable of very high speed operation, very precise time and voltage and current measurement, and must be able to handle devices with hundreds and hundreds of connections. To be able to handle different devices, a load board is often fabricated to connect a device under test (DUT) to the tester. These DUT boards are also very very expensive.

A tester generally has two major categories of electronics that can connect to a pin, a tester pin which can drive or receive a signal and measure such (often called a channel, or test channel, or tester channel, or measurement channel), and a device power supply (DPS) for powering the device. The test channel is often denoted as TC.

Tester channels and device power supplies are very different in their capabilities. Device power supplies can provide large amounts of power but are limited in speed of operation (e.g. slew rate), for example. Tester channels on the other handle cannot handle much power but are capable of high transition speeds, accurate measurements, etc.

Additionally, a tester is often used to test more than one of the same part at a time. It may have several test sites for testing devices, for example, four parts may be tested at the same time (DUT1, DUT2, DUT3, DUT4). Thus the number of tester channels and device power supplies is increased.

Commonly a tester has many more tester channels that device power supplies. Device power supply cards can be very expensive, for example, $90K/card.

When a device needs more power supplies than a tester has, this presents a technical problem which needs a technical solution.

BRIEF DESCRIPTION OF THE DRAWINGS

The invention is illustrated by way of example and not limitation in the figures of the accompanying drawings in which:

FIG. 9 illustrates one embodiment in flow chart form.

FIG. 11 illustrates various embodiments.

DETAILED DESCRIPTION

In one embodiment, using the disclosed techniques a tester channel can be used as a device power supply.

In one embodiment a tester channel serves as input to a voltage and current driver whose output is connected to one or more device power supplies where a current to voltage converter is used to derive a device power supply on a tester channel.

In one embodiment a tester channel serves as input to voltage inverter whose output drives a voltage and current driver whose output is connected to one or more device power supplies where a current to voltage converter is used to derive a device power supply on a tester channel.

In one embodiment the tester channel creates a positive voltage relative to ground. In one embodiment the tester channel creates a negative voltage relative to ground.

In one embodiment the tester channel is used to create device power supplies to increase test capacity by increasing test sites.

In one embodiment use is made of one tester channel, say tester channel x, as a programmable voltage source, for example the vih/vil (Voltage Input High/Voltage Input Low). Tester channel x will drive a driver circuit that provides the required voltage and current to DUT's power pin. In one embodiment, use is made of another tester channel, say tester channel y, for current measurement (e.g. by measuring voltage). In one embodiment, optionally another tester channel is used, say tester channel z, for current range selection (e.g. via relay control).

In one embodiment a tester's utility power supply, for example +5VDC, may be used for powering a driver circuit. In one embodiment an external (to the tester) power supply may be used for powering a driver circuit.

In one embodiment the driver circuit has 2 main blocks, a voltage and current driver, and a current to voltage converter.

Figure 3:
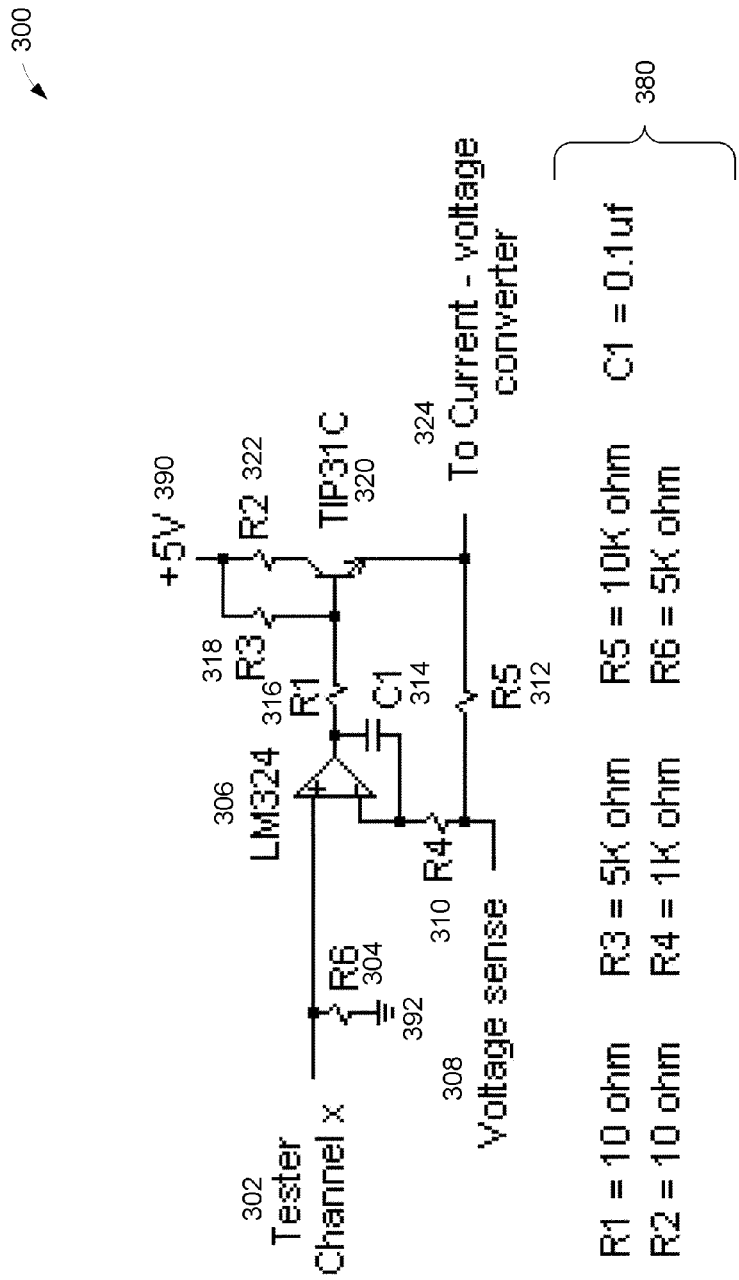
FIG. 3 illustrates one embodiment of a voltage and current driver.

FIG. 3 illustrates, generally at 300, one embodiment of a voltage and current driver. While the figure and description note specific parts and values for this embodiment, the invention is not so limited and the same circuit topology with different parts and values may be used to produce other outputs. For example, a +5V supply is shown in FIG. 3 and thus the voltage swings are limited to this range. In another embodiment the supply voltage may be different and higher or lower allowing for different outputs.

In FIG. 3 at 302 is Tester Channel x whose output goes to resistor R6 304, and the positive input of LM324 306. Resistor R6 304 is also connected to ground 392. At 308 is Voltage sense connected to resistor R4 310 and resistor R5 312. Resistor R4 310 is also connected to the negative input of LM324 306 and to capacitor C1 314. The output of LM324 306 is connected to resistor R1 316 and capacitor C1 314. Resistor R1 316 is also connected to resistor R3 318 and the base of transistor TIP31C 320. Resistors R3 318 and R2 322 are connected to a supply voltage, in this FIG. 3 as shown, +5V 390. The collector of transistor TIP31C 320 is connected to R2 322. The emitter of transistor TIP31C 320 is connected to resistor R512 and via link 324 To Current-voltage converter. In this embodiment values are 380: R1=100, R2=100, R3=5KΩ, R4=1KΩ, R5=10KΩ, R6=5KΩ, C1=0.1 µf.

In one embodiment, for example, as shown in FIG. 3, the LM324 306, R1 316, TIP31C 320, and R4 310, R5 312 form a unity gain driver loop. TIP31C 320 emitter outputs the driver's force line which goes via 324 to a current-voltage converter circuit and then to DUT's power pin. The remote voltage, at the DUT's power pin where the force line is ended, is sensed back through R4 310 resistor. R6 304 provides a 0V input when tester channel x is not connected to op amp (LN324 306) input. R2 322 acts as an over current protection for TIP31C 320.

Figure 4:
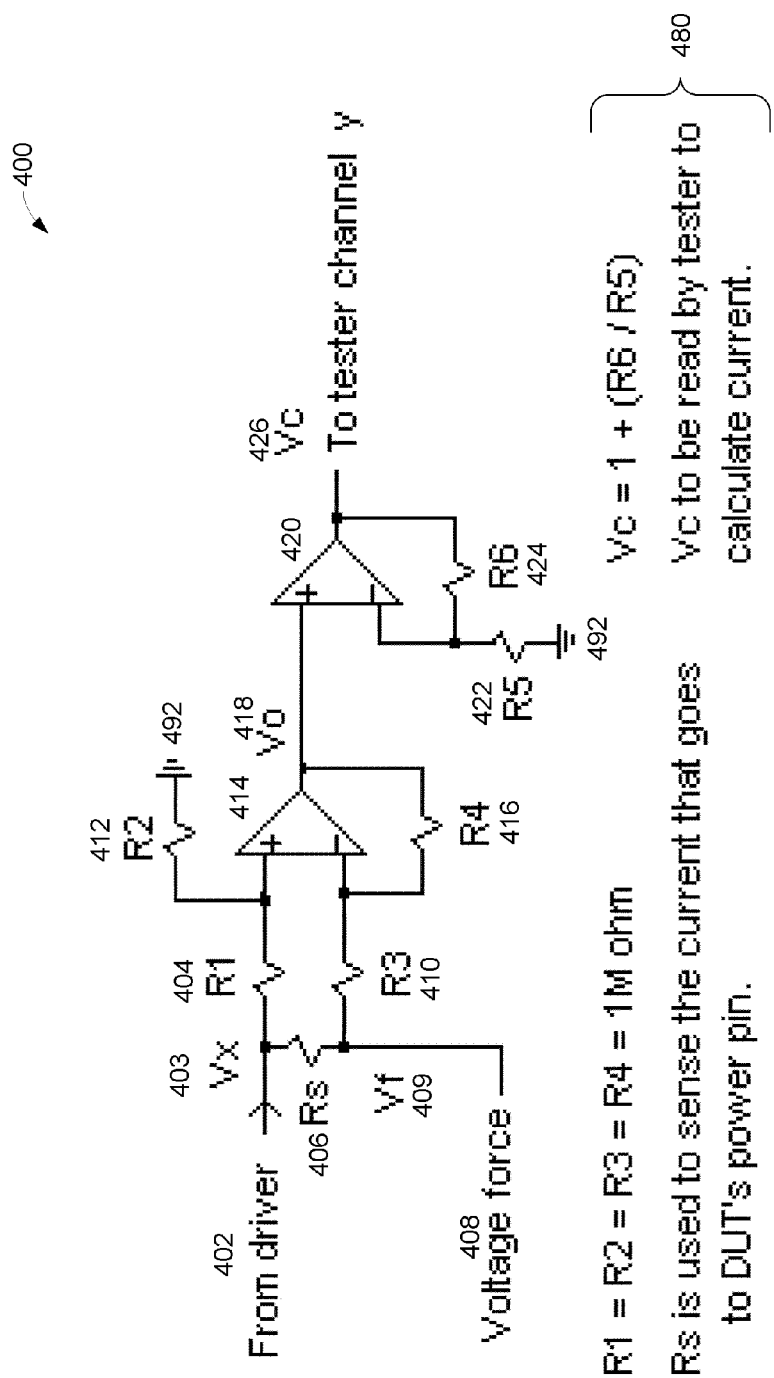
FIG. 4 illustrates one embodiment of a current to voltage converter.

FIG. 4 illustrates, generally at 400, one embodiment of a current to voltage converter. While the figure and description note specific parts and values for this embodiment, the invention is not so limited and the same circuit topology with different parts and values may be used to produce other outputs. For example, R1 and R2 values of 1MΩ are shown in FIG. 4, in another embodiment these may be different and higher or lower in resistance.

In FIG. 4 at 402 is From driver whose voltage is denoted as Vx 403. From driver 402 is connected to resistor R1 404 and resistor Rs 406. Voltage force 408 whose voltage is denoted as Vf 409. Voltage force 408 is connected to resistor Rs 406 and resistor R3 410. Resistor R1 404 is also connected to the positive input of amplifier 414 and resistor R2 412. Resistor R2 412 is also connected to ground 492. Resistor R3 410 is connected to the negative input of amplifier 414 and resistor R4 416. The output of amplifier 414 whose voltage is denoted Vo 418. The output of amplifier 414 is connected to resistor R4 416 and to the positive input of amplifier 420. Ground 492 is connected to resistor R5 422. Resistor R5 422 is also connected to the negative input of amplifier 420 and resistor R6 424. Amplifier 420 whose output voltage is denoted on link 426 as Vc. Amplifier 420 output is connected to resistor R6 424 and To tester channel y via link 426. In this embodiment values are 480: R1=R2=R3=R4=1 MΩ. Rs is used to sense the current that goes to the DUT's power pin. Vc=1+(R6/R5). And in one embodiment Vc can be read by a tester (e.g. via a tester channel) to calculate current.

In one embodiment, for example, as shown in FIG. 4, the amplifiers may be operational amplifiers (op amps) and powered from a +5V supply. R1 404, R2 412, R3 410, R4 416 form a differential op amp. The voltage drop across Rs denoted as Vs, Vs=(Vx 403−Vf 409) will appear as Vo 418. R5 422, R6 424 form a voltage multiplier to Vo 418 input. A tester PMU (parametric measurement unit) may be used to measure the voltage on Vc 426 (e.g. To tester channel y) to calculate the current flows through Rs 406. In one embodiment the amplifiers may be LM324 op amps powered by a +5V supply and the Vc 426 output may be within a 0-4V range. Once the R5 422, R6 424 multiplication factor is fixed (e.g. 1+(R6/R5), one can determine the Rs 406 value based on the current range that has been measured.

Figure 5:
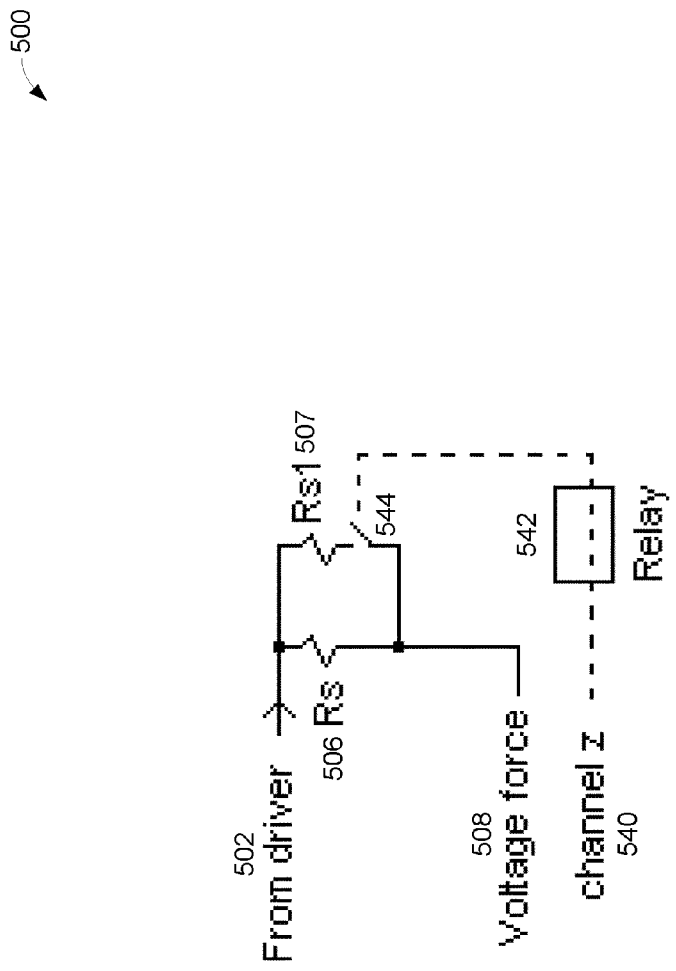
FIG. 5 illustrates one embodiment of a current range select.

FIG. 5 illustrates, generally at 500, one embodiment of a current range select. In FIG. 5 at 502 is From driver and is connected to resistor Rs 506 and resistor Rs1 507. Voltage force 508 is connected to resistor Rs 506 and to a switch 544. Switch 544 when closed connects resistor Rs1 507 in parallel with resistor Rs 506. Switch 544 is part of relay 542 and is controlled by channel z 540. Channel z 540 is from a tester.

In one embodiment, for example, as shown in FIG. 5, Rs resistor should be properly selected so that the voltage drop across it is not too big. For example, it should be about 0.5V at a DUT's full current load. This is to make sure the unity gain of the op amps working properly. In one embodiment, Rs1 may be a 0 ohm resistor and is connected when current measurement is not required. In one embodiment only a single relay is needed for the current range select and tester channel may be used of relay control, for example, use tester channel z for relay control.

Figure 6A:
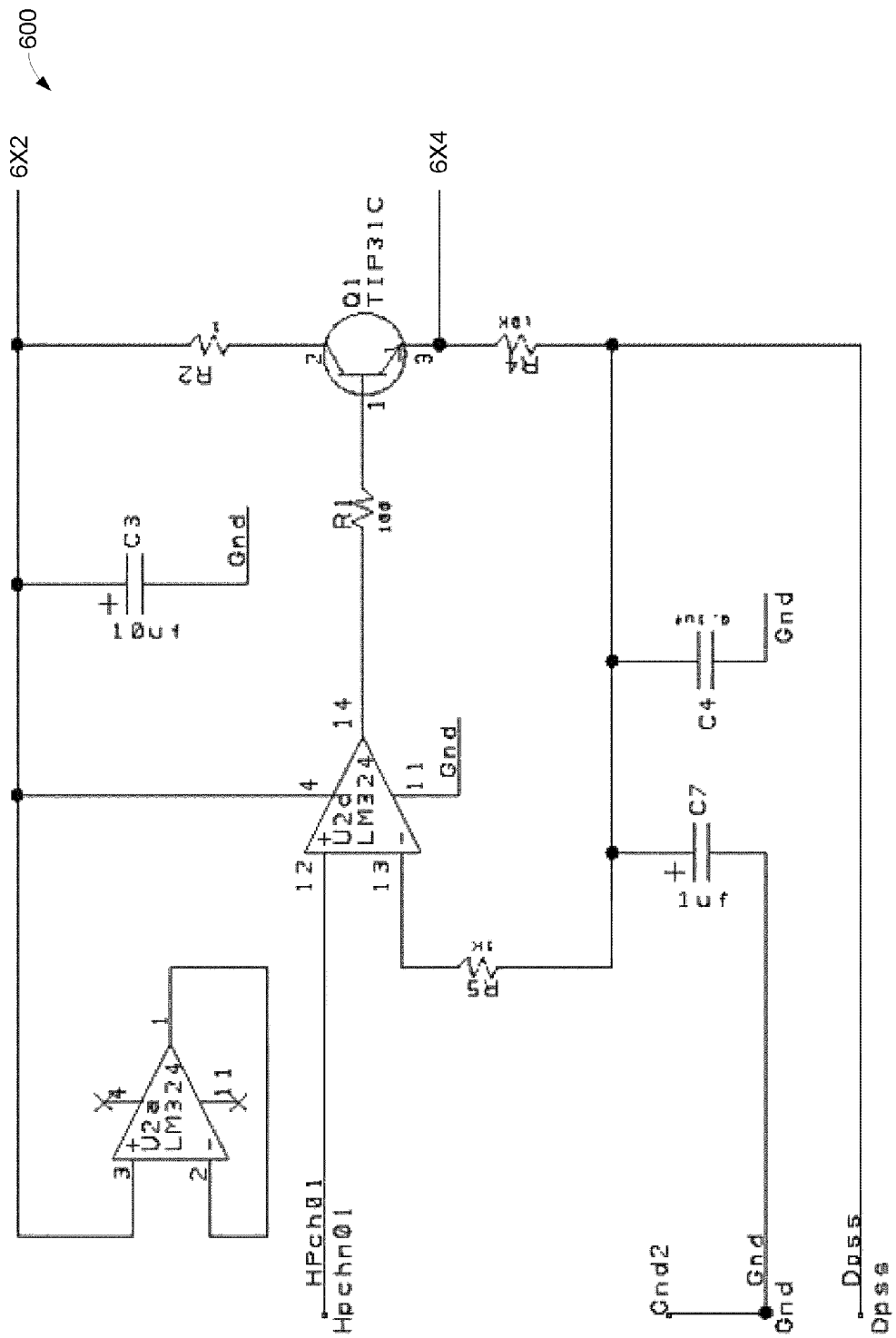
FIG. 6 which consists of FIGS. 6A, 6B, and 6C illustrate one embodiment.
Figure 6B:
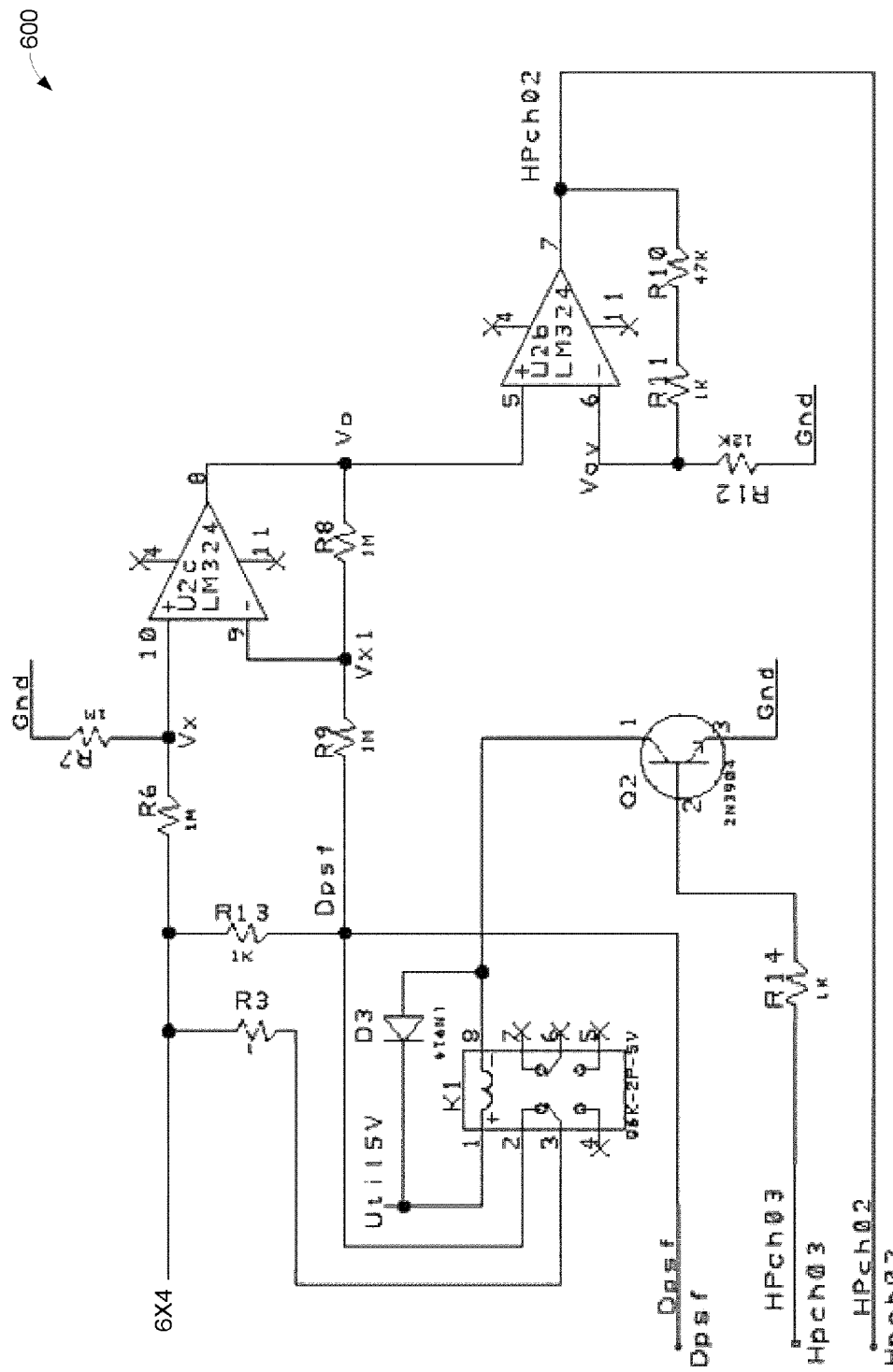
Figure 6C:
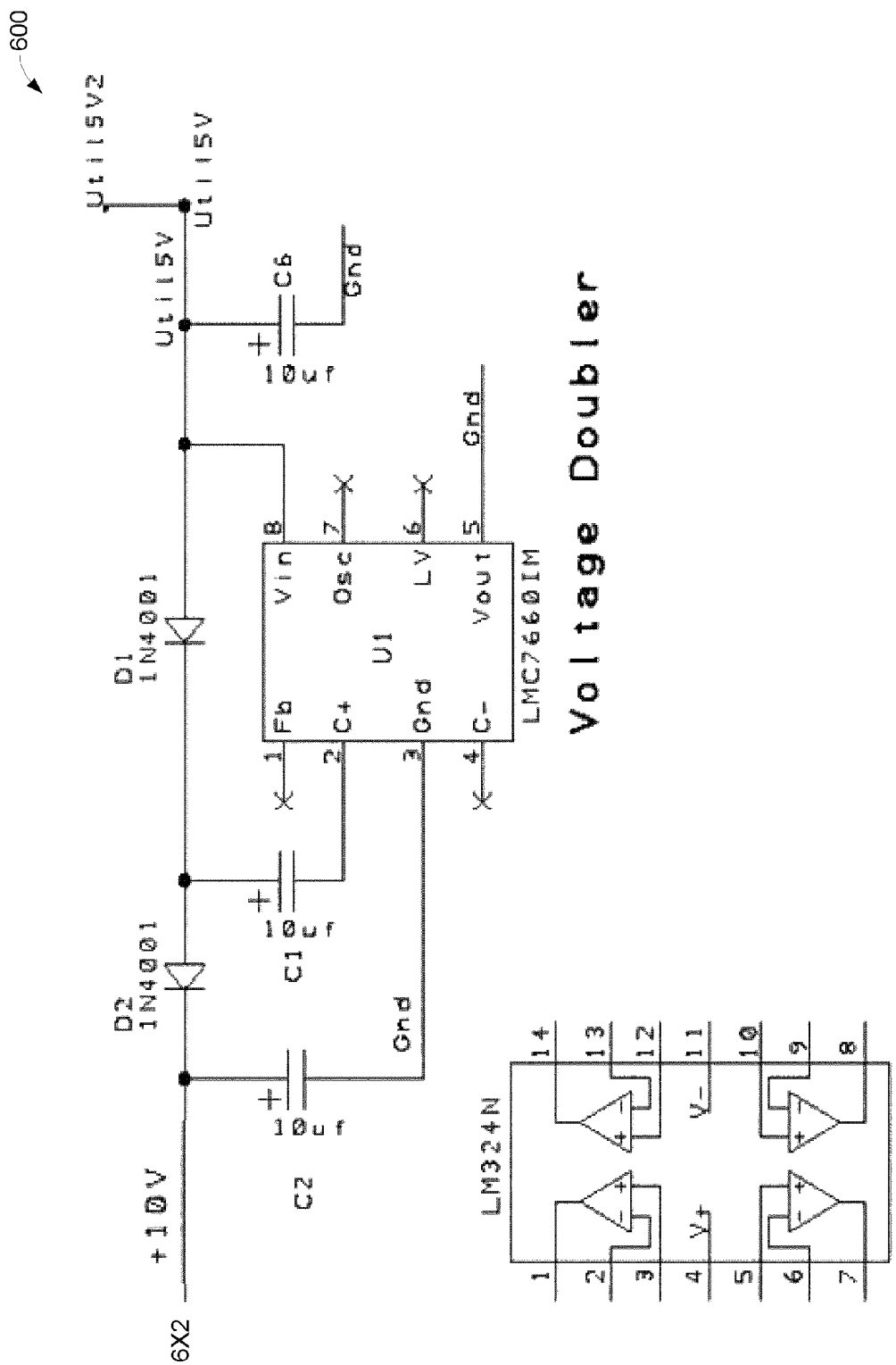

FIG. 6 which consists of FIGS. 6A, 6B, and 6C illustrate, generally at 600, one embodiment. 6×2, and 6×4 are inter page connections. In the embodiment shown in FIG. 6 a voltage doubler is used to boost the voltage to the driver circuit so that the DUT power supply can be above 5 volts. As shown in FIG. 6 the DUT power supply is a positive voltage supply.

As illustrated in FIG. 6, one of skill in the art will recognize that the voltage at $$HPch02 = Vo*(R10+R11+R12)/R12 \qquad \text{(Equation 1)}$$

Figure 7A:
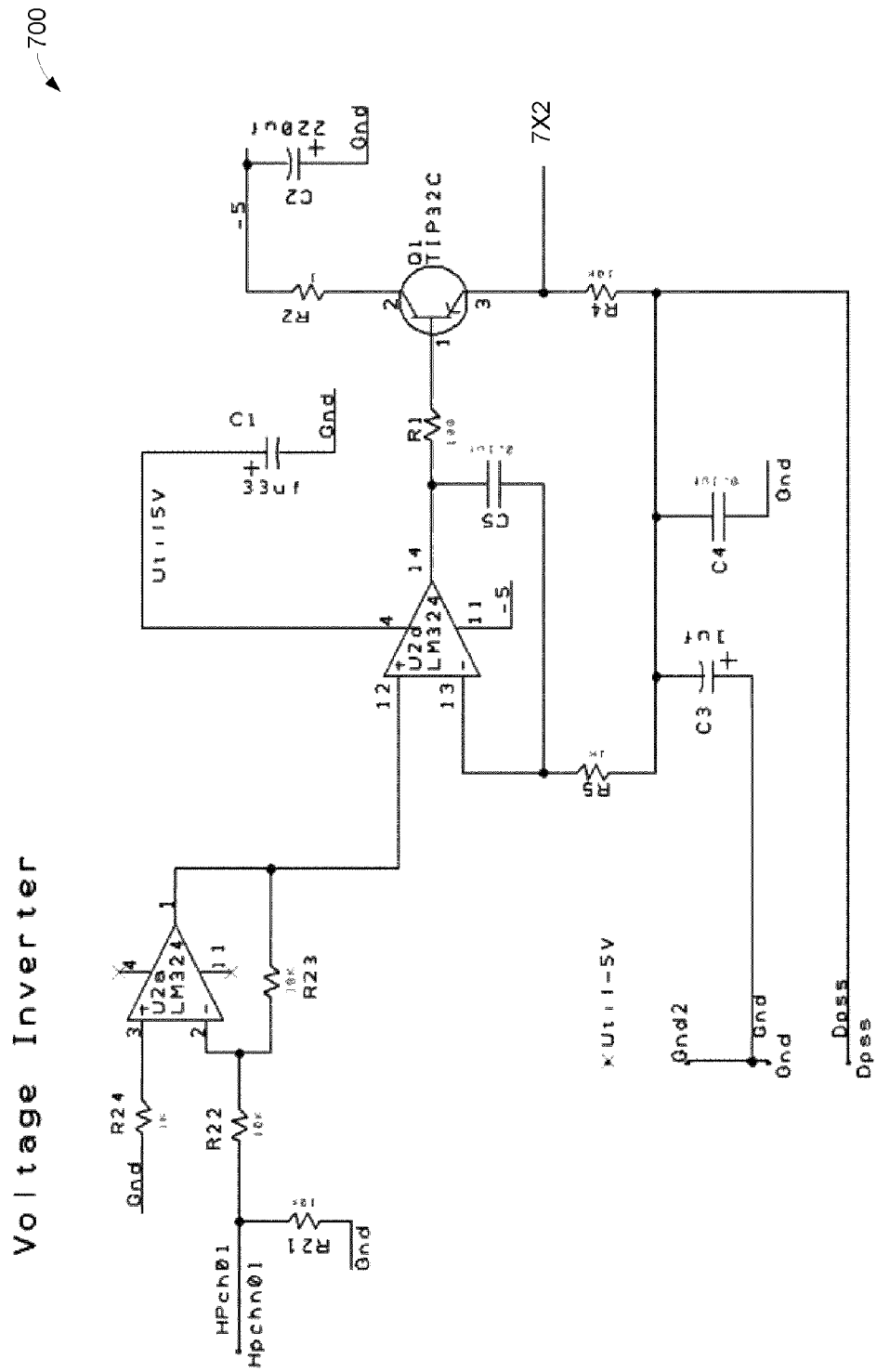
FIG. 7 which consists of FIGS. 7A, and 7B illustrate one embodiment.
Figure 7B:
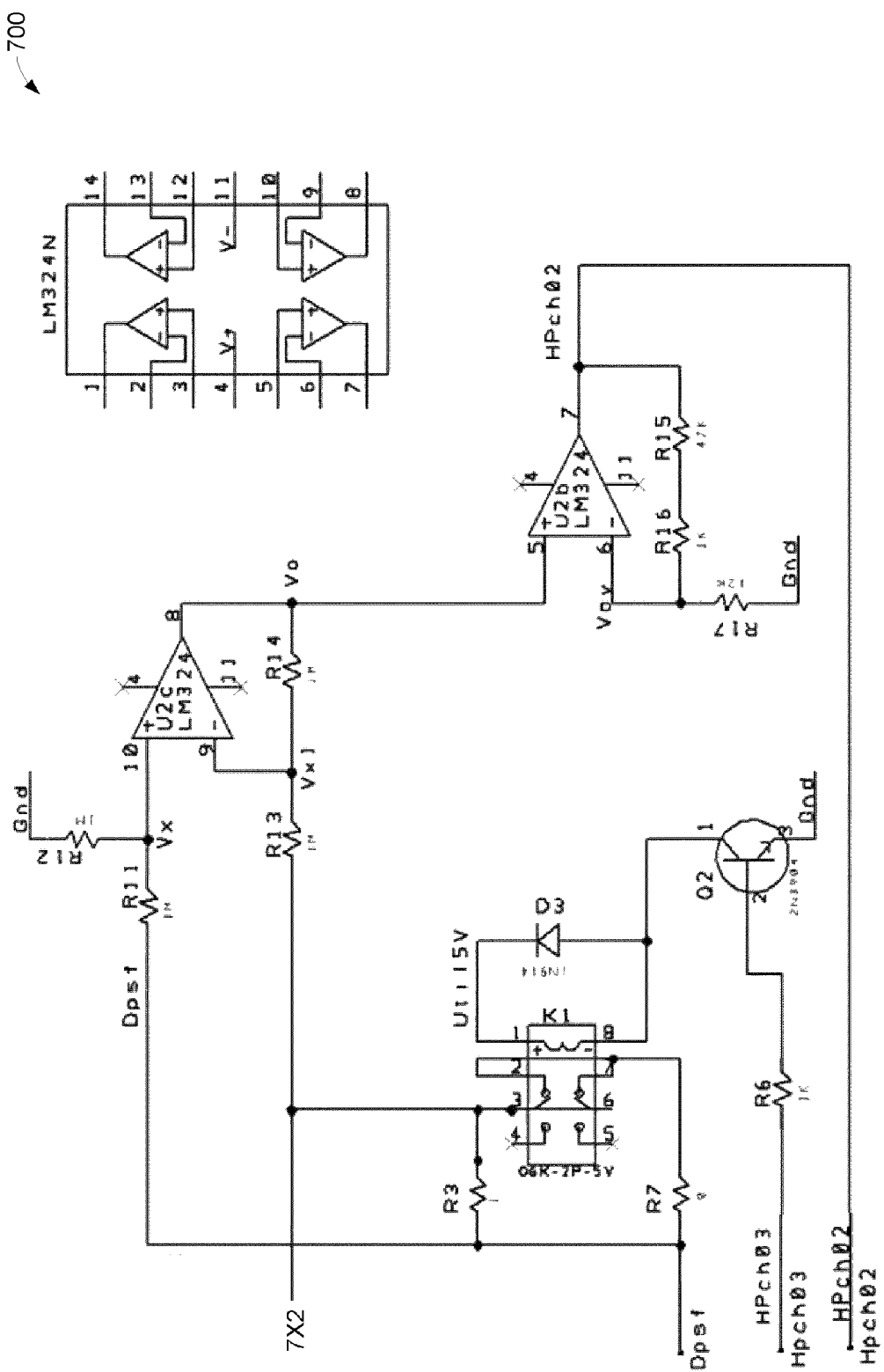

FIG. 7 which consists of FIGS. 7A, and 7B illustrate, generally at 700, one embodiment. 7×2 is an inter page connection. In the embodiment shown in FIG. 7 a negative driver supply voltage to the driver circuit is used as well as a voltage inverter and the generated DUT power supply can be below ground potential. As shown in FIG. 7 the DUT power supply is a negative voltage supply.

Figure 8A:
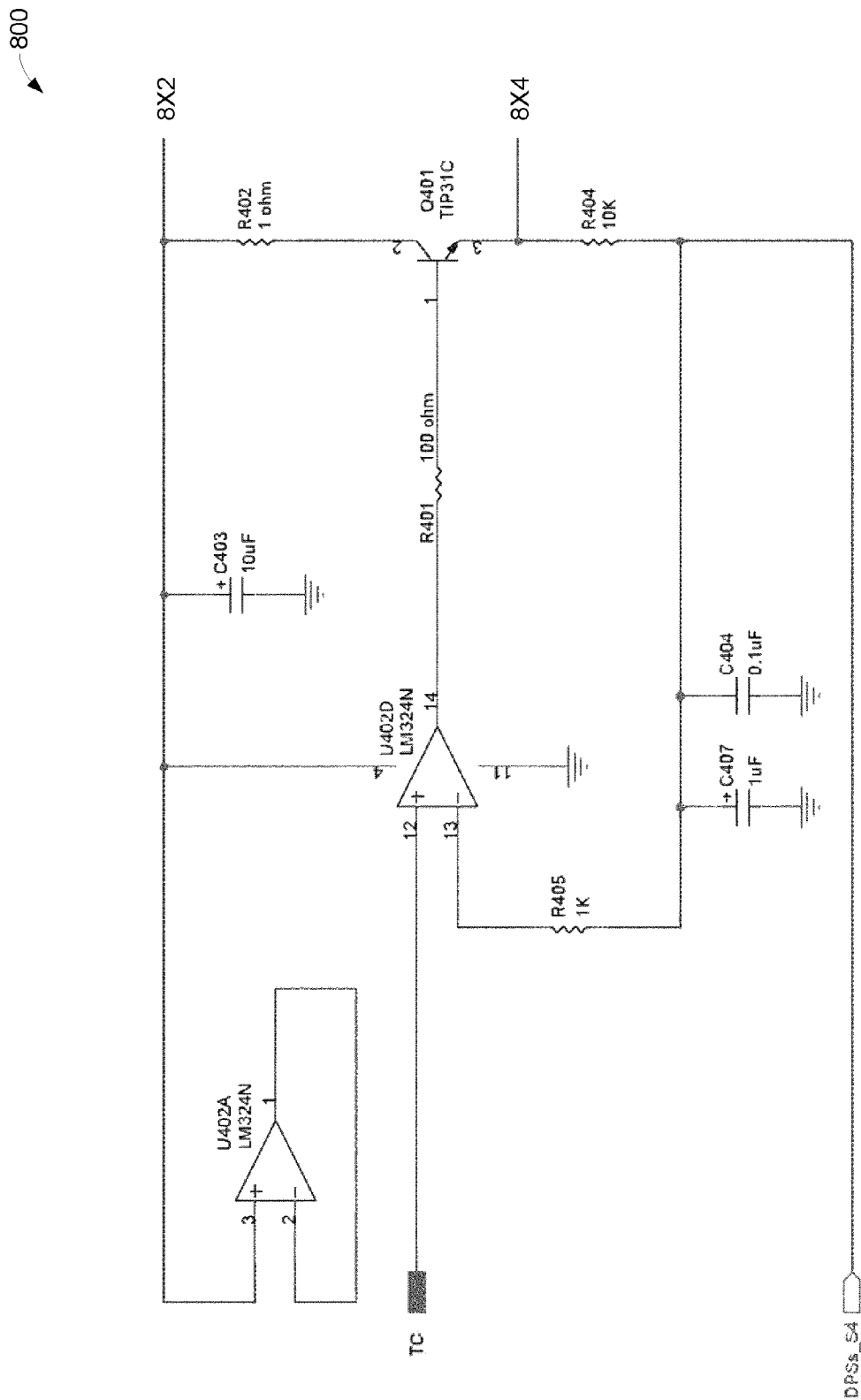
FIG. 8 which consists of FIGS. 8A, 8B, and 8C illustrate a driver circuit.
Figure 8C:
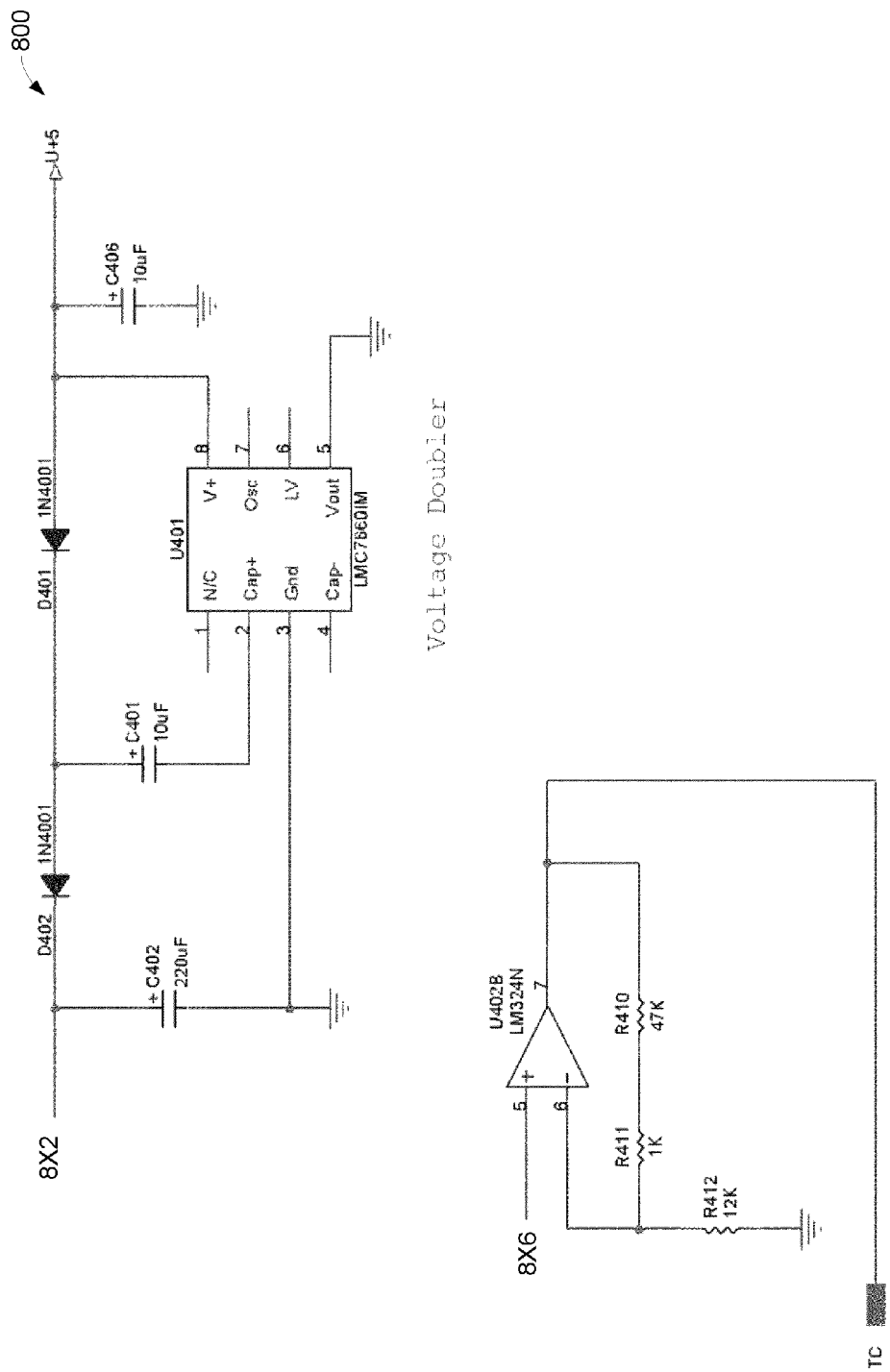

FIG. 8 which consists of FIGS. 8A, 8B, and 8C illustrate, generally at 800, a $4^{th}$ driver circuit on a load board (note for example 4 in the notation, e.g. DPSf_S4).

FIG. 9 illustrates, generally at 900, one embodiment in flow chart form. At 902 is received a tester channel output. At 904 the tester channel output 902 is optionally inverted. At 906 the tester channel output 902 or the optionally inverted 904 tester channel output 902 is amplified by a voltage and current driver 908. At 910 is a voltage sense for measuring the voltage output by the voltage and current driver 908. At 912 is a current to voltage converter that takes as an input the output of the voltage and current driver 908. At 914 is a voltage force input to the voltage and current driver 908. The output 916 of the voltage and current driver 908 is sent to a tester channel 918 to be used as a device power supply. At 920 is an optional tester channel input so that the tester channel 918 voltage may be measured.

Figure 10:
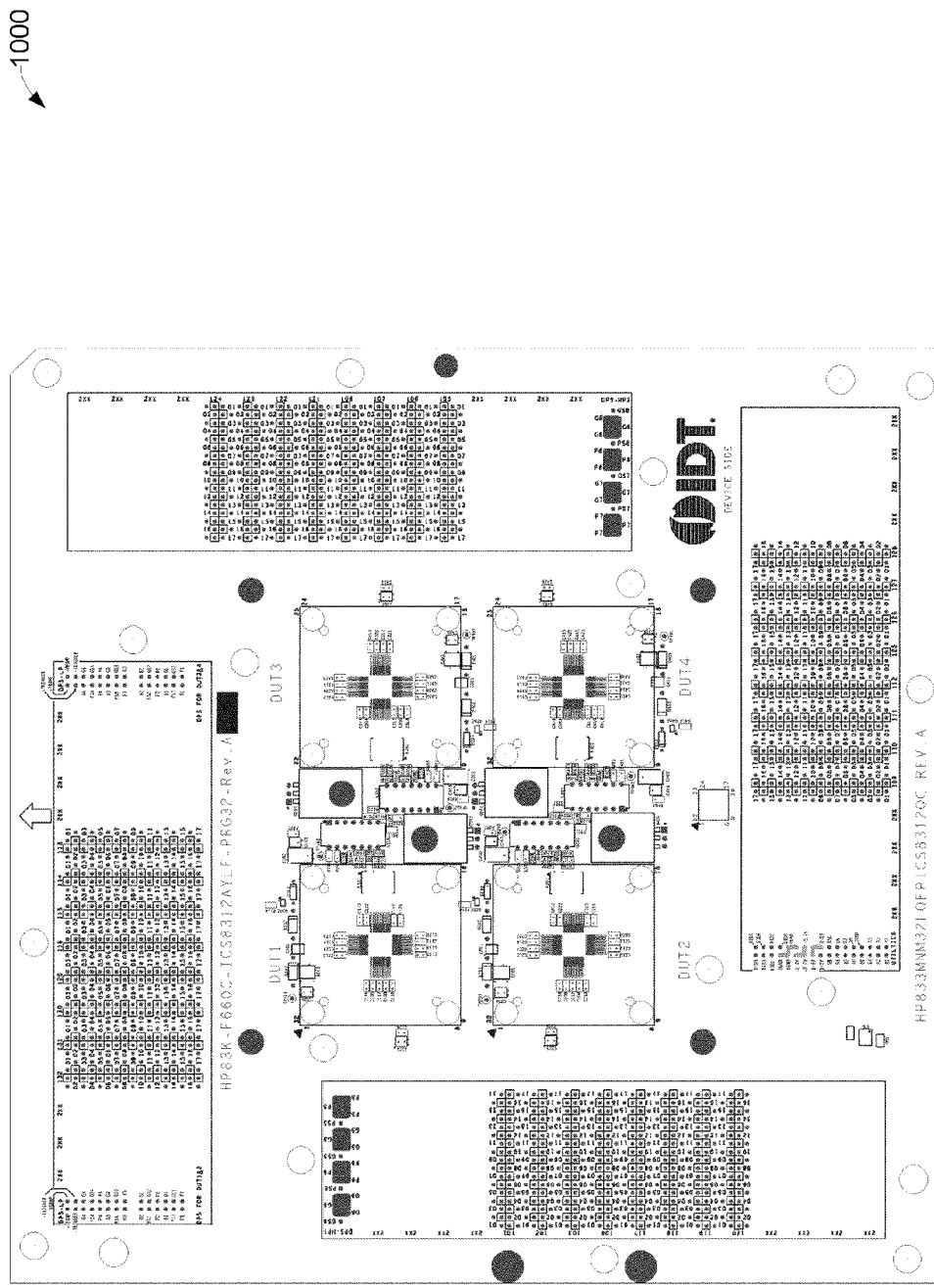
FIG. 10 illustrates one embodiment showing the top layer of a load board.

FIG. 10 illustrates, generally at 1000, one embodiment showing the top layer of a load board having four testing positions, DUT1, DUT2, DUT3, and DUT4.

Figure 12:
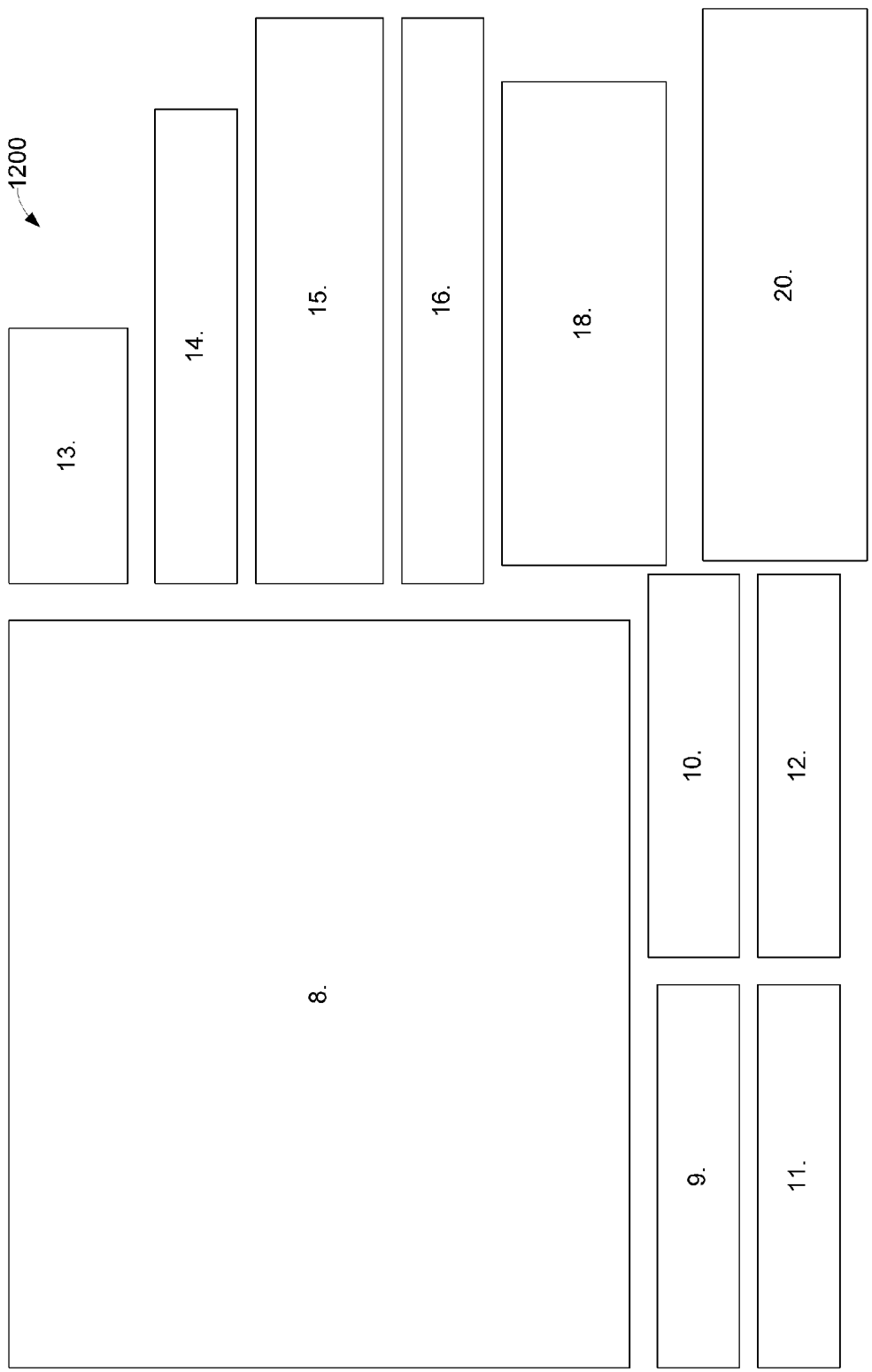
FIG. 12 illustrates various embodiments.

FIG. 11 and FIG. 12 illustrate, generally at 1100 and 1200 respectively, various embodiments.

In FIG. 11 is shown:

At 1. An apparatus comprising: a voltage and current driver, said voltage and current driver having a first tester channel input, and said voltage and current driver having an output; a current to voltage converter, said current to voltage converter having an input, and said current to voltage converter having an output; said voltage and current driver output operatively coupled to said current to voltage converter input; and said current to voltage converter output for driving a device power supply for a device under test.

At 2. The apparatus of claim 1 wherein said voltage and current driver further comprises a voltage sense port.

At 3. The apparatus of claim 2 wherein said voltage sense port is connected to a second tester channel input.

At 4. The apparatus of claim 3 wherein said current to voltage converter further comprises a voltage force port.

At 5. The apparatus of claim 4 wherein said current to voltage converter voltage force port is connected to a third tester channel output.

At 6. The apparatus of claim 1 wherein said current to voltage converter output is connected to a tester channel input.

At 7. The apparatus of claim 1 wherein said voltage and current driver further comprises: a first resistor, said first resistor having a first port, said first resistor having a second port, said first resistor first port connected to said first tester channel input, said first resistor second port connected to a ground; a first amplifier, said first amplifier having a non-inverting input, said first amplifier having an inverting input, said first amplifier having an output, said first amplifier non-inverting input connected to said first tester channel input; a second resistor, said second resistor having a first port, said second resistor having a second port, said second resistor second port connected to a voltage sense port, said second resistor first port connected to said first amplifier non-inverting input; a third resistor, said third resistor having a first port, said third resistor having a second port, said third resistor first port connected to said first amplifier output; a first capacitor, said first capacitor having a first port, said first capacitor having a second port, said first capacitor first port connected to said first amplifier output, said first capacitor second port connected to said first amplifier inverting input; a first transistor, said first transistor having a base, said first transistor having a collector, said first transistor having an emitter, said second resistor second port connected to said first transistor base; a fourth resistor, said fourth resistor having a first port, said fourth resistor having a second port, said fourth resistor first port connected to a power supply, said fourth resistor second port connected to said first transistor base; a fifth resistor, said fifth resistor having a first port, said fifth resistor having a second port, said fifth resistor first port connected to said power supply, said fifth resistor second port connected to said first transistor collector; and a sixth resistor, said sixth resistor having a first port, said sixth resistor having a second port, said sixth resistor first port connected to said second resistor second port, said sixth resistor second port connected to said first transistor emitter.

At 17. An apparatus for using a tester channel to supply device power to a device under test, the apparatus comprising: means for receiving an output from said tester channel as an input; means for changing said input using a voltage and current driver; means for changing an output from said voltage and current driver using a current to voltage converter; and means for sending an output from said current to voltage converter to a device power supply for said device under test.

At 19, The method of claim 18 further comprising: (a1) between step (a) and step (b) the inverting said input.

In FIG. 12 is shown:

At 8. The apparatus of claim 7 wherein said current to voltage converter further comprises: a seventh resistor, said seventh resistor having a first port, said seventh resistor having a second port, said seventh resistor first port connected to said first transistor emitter, said seventh resistor second port connected to a voltage force port; an eighth resistor, said eighth resistor having a first port, said eighth resistor having a second port, said eighth resistor first port connected to said first transistor emitter; a ninth resistor, said ninth resistor having a first port, said ninth resistor having a second port, said ninth resistor first port connected to said voltage force port; a second amplifier, said second amplifier having a non-inverting input, said second amplifier having an inverting input, said second amplifier having an output, said second amplifier non-inverting input connected to said eighth resistor second port, said second amplifier inverting input connected to said ninth resistor second port, a tenth resistor, said tenth resistor having a first port, said tenth resistor having a second port, said tenth resistor first port connected to second amplifier non-inverting input, said tenth resistor second port connected to said ground; an eleventh resistor, said eleventh resistor having a first port, said eleventh resistor having a second port, said eleventh resistor first port connected to said second amplifier inverting input, said eleventh resistor second port connected to said second amplifier output; a third amplifier, said third amplifier having a non-inverting input, said third amplifier having an inverting input, said third amplifier having an output, said third amplifier non-inverting input connected to said second amplifier output; a twelfth resistor, said twelfth resistor having a first port, said twelfth resistor having a second port, said twelfth resistor first port connected to said third amplifier inverting input, said twelfth resistor second port connected to said ground; a thirteenth resistor, said thirteenth resistor having a first port, said thirteenth resistor having a second port, said thirteenth resistor first port connected to said third amplifier inverting input, said thirteenth resistor second port connected to said third amplifier output.

At 9. The apparatus of claim 8 wherein said voltage sense port is connected to a second tester channel.

At 10. The apparatus of claim 9 wherein said voltage force port is connected to a third tester channel.

At 11. The apparatus of claim 10 wherein said third amplifier output is connected to a fourth tester channel.

At 12. The apparatus of claim 10 wherein said third amplifier output is connected to a device power supply of a device under test.

At 13. The apparatus of claim 10 further comprising a fourteenth resistor selectively connected in parallel with said seventh resistor.

At 14. The apparatus of claim 13 wherein said selectively connected is via a relay, said relay for receiving a fourth tester channel for effecting operation of said relay.

At 15. The apparatus of claim 1 further comprising a voltage inverter, said voltage inverter having an input, said voltage inverter having an output, said voltage inverter input for receiving a first tester channel output, said voltage inverter output coupled to said voltage and current driver first tester channel input.

At 16. The of apparatus of claim 8 wherein said voltage and current driver and said current to voltage converter are repeated a plurality of times equal in number to a plurality of devices under test.

At 18. An electrical method comprising in order: (a) receiving a tester channel output as an input; (b) using a voltage and current driver to boost said input; (c) using a current to voltage converter to convert an output from said voltage and current driver; and (d) supplying an output from said current to voltage converter to a device power supply to a device under test.

At 20. The method of claim 19 further comprising: supplying a voltage sense signal for measuring a voltage output by said voltage and current driver; receiving a second tester channel input as a voltage force input to said voltage and current driver; and supplying a supply voltage output signal for measuring a voltage output by said current to voltage converter.

Thus a Method and Apparatus for using Tester Channel as Device Power Supply have been described.

Figure 1:
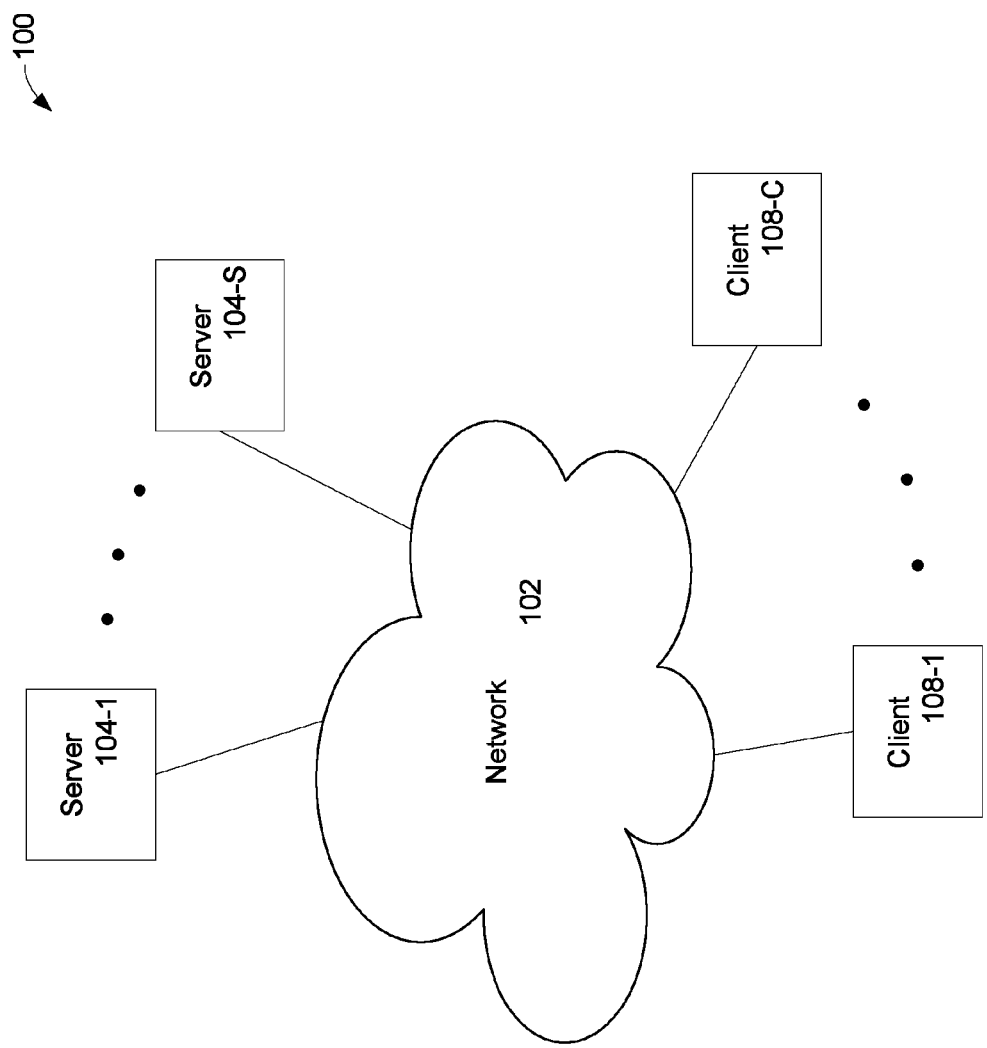
FIG. 1 illustrates a network environment in which the method and apparatus of embodiments may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
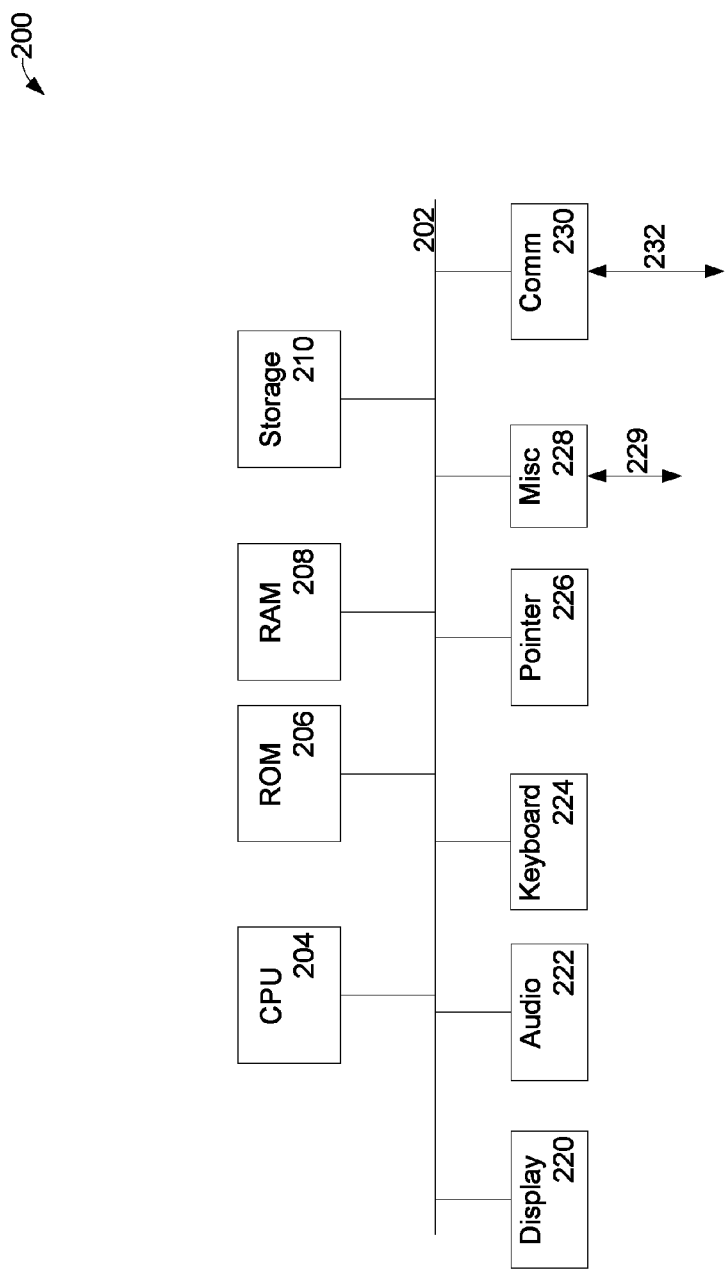
FIG. 2 is a block diagram of a computer system in which some embodiments may be used.

FIG. 2 is a block diagram of a computer system 200 in which some embodiments may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the embodiments may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio 222, keyboard 224, pointer 226, miscellaneous input/output (I/O) devices 228, link 229, communications 230, and port 232. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might benefit from an embodiment. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the embodiments, it is to be understood that various terms are used by those knowledgeable in the art to describe techniques and approaches. Furthermore, in the description, for purposes of explanation, numerous specific details are set forth in order to provide a thorough understanding of the embodiments. It will be evident, however, to one of ordinary skill in the art that the present embodiments may be practiced without these specific details. In some instances, well-known structures and devices are shown in block diagram form, rather than in detail, in order to avoid obscuring the embodiments. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer. Storing electronic instructions is defined herein as storing a physical representation of such electronic instruction and since the medium for storage is physical the physical medium cannot be considered transitory because physical medium does not exist or last only a short time, nor is it short-lived, nor is it temporary.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any non-transitory mechanism for storing or transmitting information in a form readable by a machine (e.g., a computer). For example, a machine-readable medium includes read only memory (ROM); random access memory (RAM); magnetic disk storage media; optical storage media; flash memory devices; mechanical, electrical, optical, acoustical or other forms of non-transitory signals.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as "substantially equal" is used to indicate that they are for all practical purposes equal.

All computer implemented embodiments using software are hereby explicitly declared to require specialized computer hardware in the form of a 64 bit left shifting barrel shifter. This explicitly declared specialized computer hardware is essential to the embodiments.

It is to be understood that in any one or more embodiments of the invention where alternative approaches or techniques are discussed that any and all such combinations as might be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a Method and Apparatus for using Tester Channel as Device Power Supply have been described.

What is claimed is:

1. An apparatus comprising:
   a voltage and current driver, said voltage and current driver having a first tester channel input, said voltage and current driver having a power supply input, and said voltage and current driver having an output;
   a current to voltage converter, said current to voltage converter having an input, and said current to voltage converter having an output;
   a bypass unit for bypassing said current to voltage converter, said bypass unit having an input, and said bypass unit having an output;
   a power supply port, said power supply port for supplying power to a device under test;
   said voltage and current driver output operatively coupled to said current to voltage converter input and to said bypass input; and
   said power supply port coupled to said current to voltage converter output and to said bypass output, and wherein said voltage and current driver has a unity voltage gain from said first tester channel input to said voltage and current driver output when said bypass unit bypasses said current to voltage converter.

2. The apparatus of claim 1 wherein said voltage and current driver further comprises a voltage sense port.

3. The apparatus of claim 2 wherein said voltage sense port is connected to a second tester channel input.

4. The apparatus of claim 3 wherein said current to voltage converter further comprises a voltage force port.

5. The apparatus of claim 4 wherein said voltage force port is connected to a third tester channel output.

6. The apparatus of claim 1 wherein said current to voltage converter output is connected to a tester channel input.

7. The apparatus of claim 1 wherein said voltage and current driver further comprises:
   a first resistor, said first resistor having a first port, said first resistor having a second port, said first resistor first port connected to said first tester channel input, said first resistor second port connected to a ground;

a first amplifier, said first amplifier having a non-inverting input, said first amplifier having an inverting input, said first amplifier having an output, said first amplifier non-inverting input connected to said first tester channel input;
a second resistor, said second resistor having a first port, said second resistor having a second port, said second resistor second port connected to a voltage sense port, said second resistor first port connected to said first amplifier non-inverting input;
a third resistor, said third resistor having a first port, said third resistor having a second port, said third resistor first port connected to said first amplifier output;
a first capacitor, said first capacitor having a first port, said first capacitor having a second port, said first capacitor first port connected to said first amplifier output, said first capacitor second port connected to said first amplifier inverting input;
a first transistor, said first transistor having a base, said first transistor having a collector, said first transistor having an emitter, said second resistor second port connected to said first transistor base;
a fourth resistor, said fourth resistor having a first port, said fourth resistor having a second port, said fourth resistor first port connected to a power supply, said fourth resistor second port connected to said first transistor base;
a fifth resistor, said fifth resistor having a first port, said fifth resistor having a second port, said fifth resistor first port connected to said power supply, said fifth resistor second port connected to said first transistor collector; and
a sixth resistor, said sixth resistor having a first port, said sixth resistor having a second port, said sixth resistor first port connected to said second resistor second port, said sixth resistor second port connected to said first transistor emitter.

8. The apparatus of claim 7 wherein said current to voltage converter further comprises:
a seventh resistor, said seventh resistor having a first port, said seventh resistor having a second port, said seventh resistor first port connected to said first transistor emitter, said seventh resistor second port connected to a voltage force port;
an eighth resistor, said eighth resistor having a first port, said eighth resistor having a second port, said eighth resistor first port connected to said first transistor emitter;
a ninth resistor, said ninth resistor having a first port, said ninth resistor having a second port, said ninth resistor first port connected to said voltage force port;
a second amplifier, said second amplifier having a non-inverting input, said second amplifier having an inverting input, said second amplifier having an output, said second amplifier non-inverting input connected to said eighth resistor second port, said second amplifier inverting input connected to said ninth resistor second port;
a tenth resistor, said tenth resistor having a first port, said tenth resistor having a second port, said tenth resistor first port connected to second amplifier non-inverting input, said tenth resistor second port connected to said ground;
an eleventh resistor, said eleventh resistor having a first port, said eleventh resistor having a second port, said eleventh resistor first port connected to said second amplifier inverting input, said eleventh resistor second port connected to said second amplifier output;
a third amplifier, said third amplifier having a non-inverting input, said third amplifier having an inverting input, said third amplifier having an output, said third amplifier non-inverting input connected to said second amplifier output;
a twelfth resistor, said twelfth resistor having a first port, said twelfth resistor having a second port, said twelfth resistor first port connected to said third amplifier inverting input, said twelfth resistor second port connected to said ground; and
a thirteenth resistor, said thirteenth resistor having a first port, said thirteenth resistor having a second port, said thirteenth resistor first port connected to said third amplifier inverting input, said thirteenth resistor second port connected to said third amplifier output.

9. The apparatus of claim 8 wherein said voltage sense port is connected to a second tester channel.

10. The apparatus of claim 9 wherein said voltage force port is connected to a third tester channel.

11. The apparatus of claim 10 wherein said third amplifier output is connected to a fourth tester channel.

12. The apparatus of claim 10 wherein said third amplifier output is connected to a device power supply of a device under test.

13. The apparatus of claim 10 further comprising a fourteenth resistor selectively connected in parallel with said seventh resistor.

14. The apparatus of claim 13 wherein said selectively connected is via a relay, said relay for receiving a fourth tester channel for effecting operation of said relay.

15. The apparatus of claim 1 further comprising a voltage inverter, said voltage inverter having an input, said voltage inverter having an output, said voltage inverter input for receiving a first tester channel output, said voltage inverter output coupled to said voltage and current driver first tester channel input.

16. The of apparatus of claim 8 wherein said voltage and current driver and said current to voltage converter are repeated a plurality of times equal in number to a plurality of devices under test.

* * * * *